(12) United States Patent
Kuo et al.

(10) Patent No.: US 8,916,480 B2
(45) Date of Patent: Dec. 23, 2014

(54) CHEMICAL VAPOR DEPOSITION FILM PROFILE UNIFORMITY CONTROL

(75) Inventors: Ming-Shiou Kuo, Taichung (TW); Chih-Tsung Lee, Hsinchu (TW); You-Hua Chou, Taipei (TW); Ming-Chin Tsai, Hsin-Chu (TW); Chia-Ho Chen, Zhubei (TW); Chin-Hsiang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 236 days.

(21) Appl. No.: 13/313,106

(22) Filed: Dec. 7, 2011

(65) Prior Publication Data

US 2013/0149871 A1    Jun. 13, 2013

(51) Int. Cl.
*H01L 21/31* (2006.01)
(52) U.S. Cl.
USPC .......................................................... 438/758
(58) Field of Classification Search
CPC ........ C23C 16/45565; B01F 5/20; B05B 1/00
See application file for complete search history.

(56) References Cited

U.S. PATENT DOCUMENTS

| 6,902,620 | B1 * | 6/2005 | Omstead et al. | 117/107 |
| 2002/0086528 | A1 * | 7/2002 | Charneski et al. | 438/680 |
| 2009/0178616 | A1 * | 7/2009 | Byun | 118/715 |
| 2010/0119727 | A1 * | 5/2010 | Takagi | 427/532 |

FOREIGN PATENT DOCUMENTS

JP    2001-210691    *    3/2001    .............. H01L 21/68

* cited by examiner

*Primary Examiner* — Mohsen Ahmadi
*Assistant Examiner* — Andre' C Stevenson
(74) *Attorney, Agent, or Firm* — Haynes and Boone, LLP

(57) ABSTRACT

The present disclosure provides for methods and systems for controlling profile uniformity of a chemical vapor deposition (CVD) film. A method includes depositing a first layer on a substrate by CVD with a first shower head, the first layer having a first profile, and depositing a second layer over the first layer by CVD with a second shower head, the second layer having a second profile. The combined first layer and second layer have a third profile, and the first profile, the second profile, and the third profile are different from one another.

16 Claims, 10 Drawing Sheets

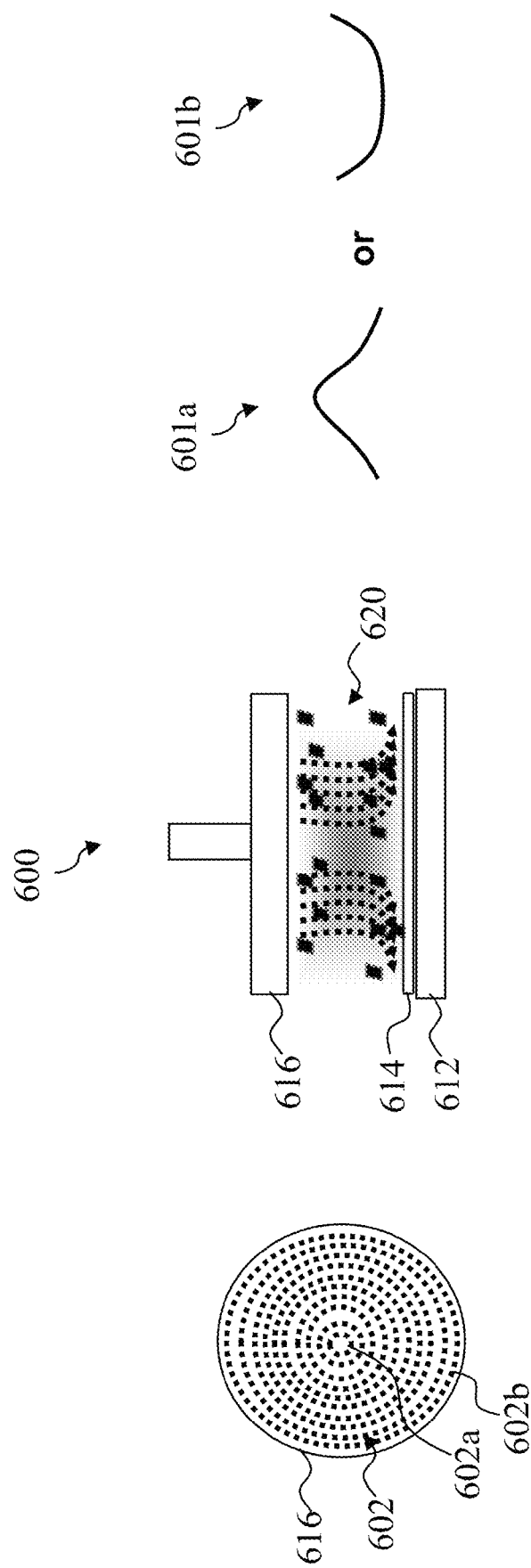

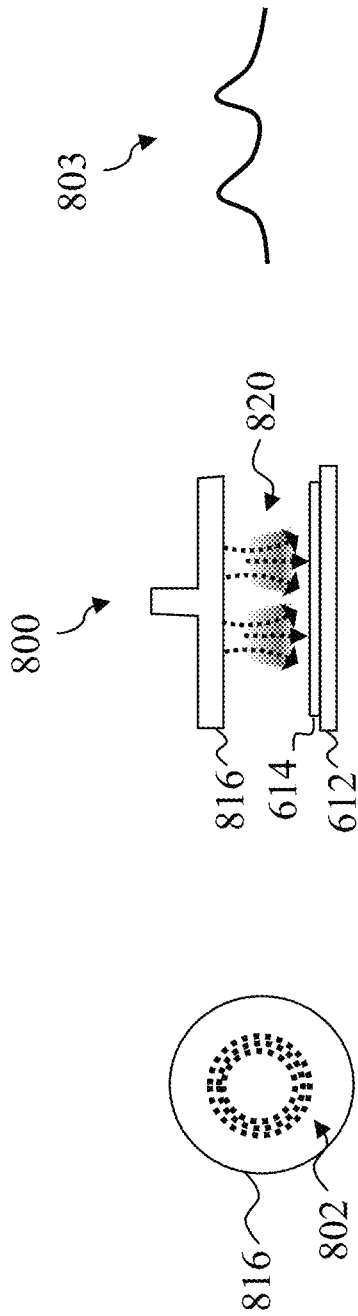

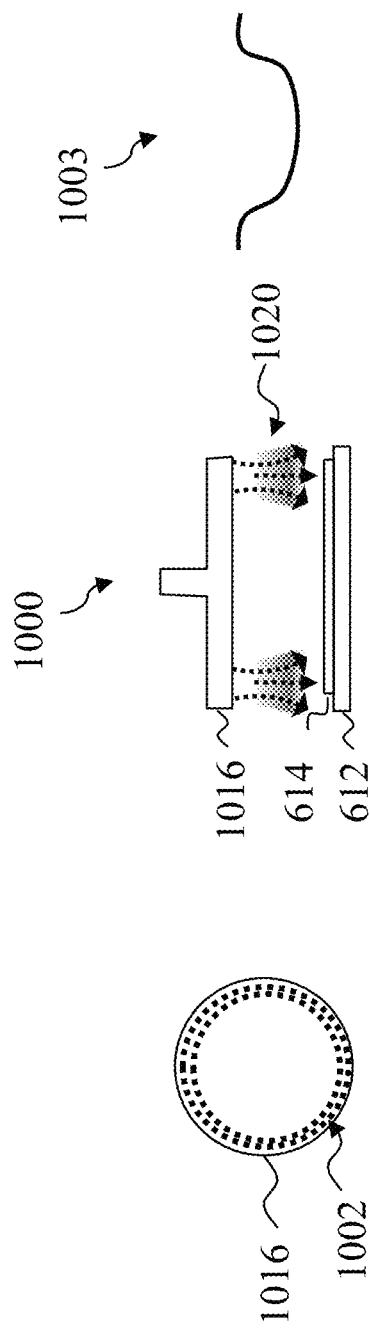

CHEMICAL VAPOR DEPOSITION FILM PROFILE UNIFORMITY CONTROL

BACKGROUND

In the semiconductor industry, chemical vapor deposition (CVD) over an entire wafer substrate has been used to deposit various layers over the substrate. However, for larger wafer sizes, such as 450 mm, control over film profile becomes more difficult and CVD has issues of film profile uniformity, such as the development of protrusions and/or depressions in the film. Control over spacing between a shower head and the substrate, the power supplied, or the flow of dilution gases has not provided satisfactory deposition control.

SUMMARY

The present disclosure provides for various advantageous embodiments for control over CVD film profile uniformity. According to one embodiment, a method for controlling chemical vapor deposition (CVD) film profile uniformity includes depositing a first layer on a substrate by CVD with a first shower head, the first layer having a first profile, and depositing a second layer over the first layer by CVD with a second shower head, the second layer having a second profile. The combined first layer and second layer have a third profile, and the first profile, the second profile, and the third profile are different from one another.

In another embodiment, a method for controlling chemical vapor deposition (CVD) film profile uniformity includes depositing a first layer over a wafer by CVD with a first shower head, with the first layer having a first profile corresponding to a first shower head aperture design, and selecting a second shower head having a second shower head aperture design associated with depositing a second layer with a second profile for adjusting the first profile. The method further includes depositing the second layer over the first layer by CVD with the second shower head, the second layer having the second profile. The combined first layer and second layer have a third profile which is more planar than the first profile and/or the second profile.

In yet another embodiment, a system for controlling chemical vapor deposition (CVD) film profile uniformity includes a first shower head having a first shower head aperture design configured to deposit a first layer on a substrate by CVD, with the first layer having a first profile corresponding to the first shower head aperture design, and a second shower head having a second shower head aperture design configured to deposit a second layer over the first layer by CVD, the second layer having a second profile corresponding to the second shower head aperture design which is different from the first shower head aperture design.

Advantageously, the present disclosure provides methods and systems for controlling profile uniformity of a chemical vapor deposition (CVD) film over a large wafer, such as over a 450 mm wafer surface. The methods and systems of the present disclosure can locally tune or provide localized control over layer profile for subsequent processing, such as an etch or CMP process.

BRIEF DESCRIPTION OF THE DRAWINGS

Aspects of the present disclosure are understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

FIGS. 6A-6C illustrate a shower head aperture design, a corresponding CVD film profile uniformity control system and plasma flow pattern, and corresponding film profiles, respectively, in accordance with embodiments of the present disclosure.

FIGS. 7A-7C, 8A-8C, 9A-9C, and 10A-10C illustrate example shower head aperture designs, corresponding CVD film profile uniformity control systems and plasma flow patterns, and corresponding film profiles, respectively, in accordance with embodiments of the present disclosure.

DETAILED DESCRIPTION

Figure 1:
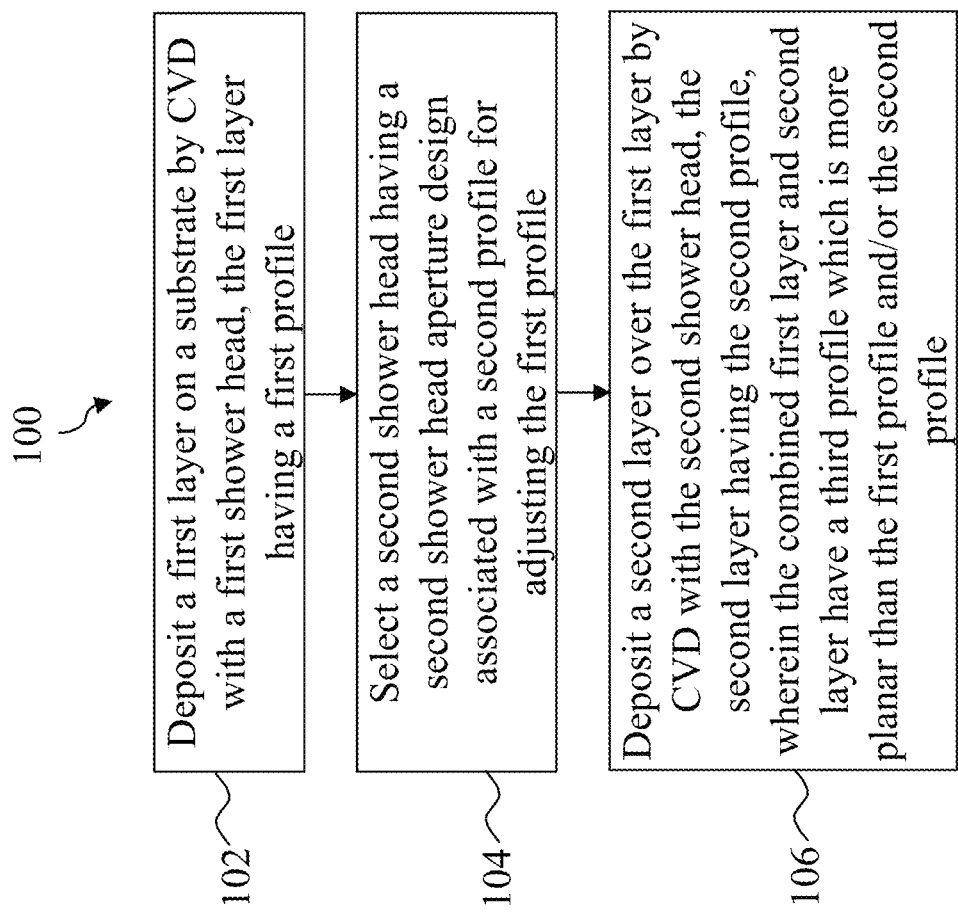
FIG. 1 is a flowchart illustrating a method for controlling CVD film profile uniformity in accordance with embodiments of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity. It is noted that the same or similar features may be similarly numbered herein for the sake of simplicity and clarity. In addition, some of the drawings may be simplified for clarity. Thus, the drawings may not depict all of the components of a given apparatus (e.g., device) or method.

Various aspects of the present disclosure will be described herein with reference to drawings that are schematic illustrations of idealized configurations of the present disclosure. As such, variations from the shapes of the illustrations as a result, for example, manufacturing techniques and/or tolerances, are to be expected. Thus, the various aspects of the present disclosure presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

It will be understood that although the terms "first", "second", "third", and so on, may be used herein to describe various process parameters or elements, such as RF power, tap setting, precursor gases, electrodes, and the like, these process parameters or elements should not be limited by these terms. These terms are only used to distinguish one process parameter or element from another process parameter or element. Thus, a first RF power, gas, tap setting, or electrode discussed below could be termed a second RF power, gas, tap setting, or electrode without departing from the teachings of the present disclosure.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

Referring now to FIG. 1, a flowchart is shown illustrating a method 100 for controlling profile uniformity of a CVD-deposited layer in accordance with embodiments of the present disclosure.

Method 100 includes at block 102, depositing a first layer on a substrate by CVD with a first shower head, the first layer having a first profile. Method 100 further includes at block 104, selecting a second shower head having a second shower head aperture design associated with a second profile for adjusting the first profile. Method 100 further includes at block 106, depositing a second layer over the first layer by CVD with the second shower head. The second layer has the second profile, and the combined first layer and second layer have a third profile which is more planar than the first profile and/or the second profile.

The various operations in method 100 described above may be performed by various techniques, means, apparatus, and/or systems. It should be noted that the operations of method 100 may be rearranged or otherwise modified within the scope of the various aspects of the present disclosure. It is further noted that additional processes may be provided before, during, and after the operations of method 100, and that some other processes may only be briefly described herein. Thus, other implementations are possible within the scope of the various aspects described herein.

According to an aspect of the present disclosure, method 100 may include depositing a first layer on a substrate by CVD with a first shower head, the first layer having a first profile; and depositing a second layer over the first layer by CVD with a second shower head, the second layer having a second profile. The combined first layer and second layer have a third profile. According to one aspect of the present disclosure, the first profile of the first layer, the second profile of the second layer, and the third profile of the combined first layer and second layer are different from one another.

According to another aspect of the present disclosure, the first layer is deposited in a first reaction chamber and the second layer is deposited in a second reaction chamber different from the first reaction chamber. In other embodiments, the first shower head and the second shower head may each be disposed within a single reaction chamber and the first layer and the second layer may each be deposited within the same reaction chamber.

According to another aspect of the present disclosure, the first profile of the first layer may include a protrusion sloping upward, the second profile of the second layer may include a depression sloping downward, and the third profile of the combined first layer and second layer may be more planar or uniform than the first profile and/or the second profile. In other embodiments, different profiles of the first layer and the second layer may be used to compensate or tune the first layer profile with the second layer profile as desired by a user, for example to make the profile of the combined first and second layers more planar, horizontal, or uniform. Accordingly, it is noted that in one example, the first profile of the first layer may include a depression sloping downward and the second profile of the second layer may include a protrusion sloping upward.

According to another aspect of the present disclosure, the second shower head aperture design may include apertures in concentric circles, and the first shower head aperture design may include apertures in concentric circles at different locations than the second shower head aperture design.

According to another aspect of the present disclosure, method 100 may further comprise depositing a third layer over the second layer by CVD with a third shower head. The third shower head may have a different aperture design than the first shower head and the second shower head.

According to another aspect of the present disclosure, method 100 may further comprise flowing a reactant gas and a dilution gas through the first shower head or the second shower head for plasma enhanced CVD (PECVD) or metal-organic CVD (MOCVD).

According to one embodiment of the present disclosure, a reaction chamber may include a first electrode configured to support a substrate (e.g., a silicon substrate) and a second electrode (e.g., a shower head electrode) disposed above the first electrode and the substrate. A radio frequency (RF) power may be applied between the first and second electrodes to deposit a layer onto the substrate. Another RF power may be applied between the first and second electrodes during a termination operation, and in one example, a second RF power may be less than a first RF power. In other words, a deposition operation may occur with the flowing of at least one reactant gas and a carrier or dilution gas into the deposition chamber and application of a first (main deposition) power level to the electrodes of the reaction chamber. A second power may be applied between electrodes of the reaction chamber during a termination operation or plasma treatment operation that subsequently occurs after the deposition operation.

In one embodiment of a PECVD process, a glow discharge (i.e., a plasma) is formed when RF power is applied between the two electrodes in the reaction chamber. Reactant gases contained within the reaction chamber produce chemically reactive species (e.g., atoms, ions, and radicals). These reactive species diffuse to and are absorbed on the surface of the substrate material. RF power may be applied to both the upper and lower electrodes. According to yet another aspect of the present disclosure, RF power may be applied to the upper electrode and the lower electrode may be held at ground potential. An impedance matching unit may be adjusted to maximize the amount of RF power absorbed by the plasma. The setting of the impedance matching unit is called a tap setting in this document and corresponds to a maximum RF power applied between the upper and lower electrodes and absorbed by the plasma.

According to an aspect of the present disclosure, the deposited layer or layers may be comprised of various materials and may include but is not limited to a silicon layer, a dielectric layer, a metal layer, combinations thereof, alloys thereof, or derivatives thereof. According to another aspect, the layer or layers may be deposited by plasma enhanced CVD (PECVD) or metal-organic CVD (MOCVD).

According to yet another aspect of the present disclosure, the first and second layers may be formed from one or more of various reactant gases or materials, including but not limited to silicon-containing materials, nitrogen-containing materials, organic materials, metal-containing materials, halogen gases, combinations thereof, and the like. The first and second layers may also be formed from one or more of various dilution gases or materials, including but not limited to inert gases, helium, argon, combinations thereof, and the like.

A wide range of power may be applied between the electrodes during the deposition operation, for example ranging between about 0 Watts and about 500 Watts, for a wide range of deposition times, for example ranging between about 1 second and about 30 seconds. A wide range of process temperatures may be used, for example ranging between about 100 degrees Celsius and about 600 degrees Celsius, and a wide range of process pressures may be used, for example ranging between about 1 Torr and about 100 Torr.

According to an aspect of the present disclosure, method 100 may further comprise performing multiple deposition cycles with shower heads having the same or different aperture design, to form a plurality of layers, with each layer deposited one above the other. Total thickness of a plurality of layers may vary and the number of deposition cycles may vary.

According to yet another aspect of the present disclosure, a RF power applied between the first and second electrodes may be changed. The RF power may be changed by various processes, such as by stopping flow of at least one reactant gas into the reaction chamber, stopping flow of at least one dilution or carrier gas into the reaction chamber, changing a chamber pressure, applying a different power to the first electrode and/or the second electrode, changing a tap setting to an impedance matching unit coupled to the second electrode, and combinations thereof.

In one example, the RF power may be passively changed by stopping flow of at least one reactant gas into the reaction chamber, stopping flow of at least one carrier gas into the reaction chamber, changing a chamber pressure, or combinations thereof. In another example, the RF power may be actively changed by applying a different power to the first electrode and/or the second electrode, changing a tap setting to an impedance matching unit coupled to the second electrode, or combinations thereof. In yet another example, during the deposition operation, a first chamber pressure, a first chamber temperature, and a first maximum applied RF power may be provided between the electrodes of the reaction chamber. During a termination operation or a plasma treatment operation, a second chamber pressure, a second chamber temperature, and a second maximum applied RF power may be provided.

According to yet another aspect of the present disclosure, plasma may be formed by applying low frequency RF (LFRF) power to the first electrode, applying high frequency RF (HFRF) power to the second electrode, and forming a plasma between the first and second electrodes.

According to yet another aspect of the present disclosure, prior to applying a RF power between the first and second electrodes, a chamber pressure may be provided between about 1 Torr and about 100 Torr during a main deposition operation, a termination operation, or a plasma treatment operation, and a chamber temperature may be provided between about 100 degrees Celsius and about 600 degrees Celsius during a main deposition operation, a termination operation, or a plasma treatment operation.

Advantageously, the present disclosure provides methods for controlling profile uniformity of a chemical vapor deposition (CVD) film over a large wafer, such as over a 450 mm wafer surface. Different shower heads with different aperture designs in conjunction with other deposition process parameters, such as precursor gas, precursor gas flow, process temperature, process pressure, and the like, may be used to provide control over the profile of deposited layers. The methods of the present disclosure can locally tune layer profile for subsequent processing, such as an etch or CMP process.

Figure 2:
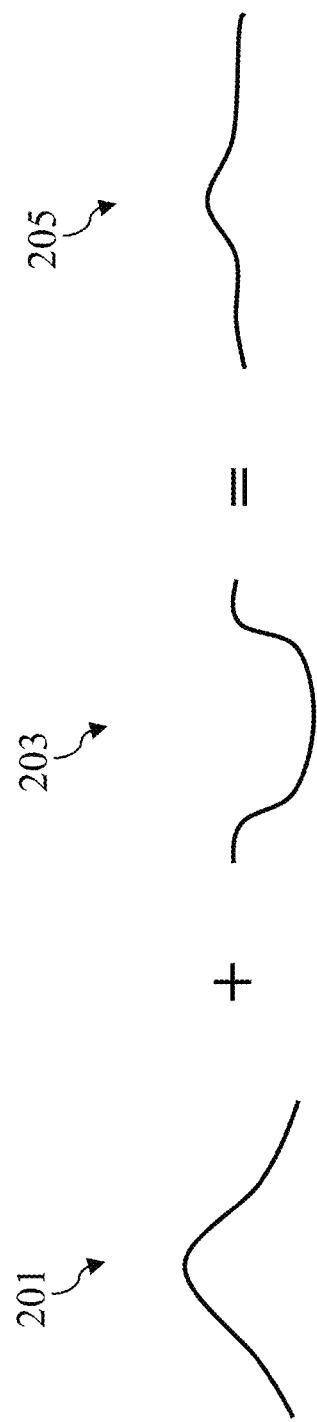
FIG. 2 illustrates a first profile of a first layer, a second profile of a second layer, and a third profile of a combined first layer and second layer in accordance with embodiments of the present disclosure.

Referring now to FIG. 2, a first profile 201 of a first layer, a second profile 203 of a second layer, and a third profile 205 of a combined first layer and second layer are illustrated in accordance with example embodiments of the present disclosure. The first profile 201 of the first layer includes a protrusion sloping upward, the second profile 203 of the second layer includes a depression sloping downward, and the third profile 205 of the combined first layer and second layer is more planar or uniform (i.e., flat or horizontal relative to the substrate surface) than the first profile 201 and/or the second profile 203. Advantageously, the second shower head associated with depositing layers with the second profile may be selected to compensate the first profile 201 of the first layer with the second profile 203 of the second layer for providing the third profile 205 of the combined first layer and second layer which is more planar than the first profile and/or the second profile. As noted above, FIG. 2 illustrates example layer profiles, and the first profile of the first layer may instead include a depression sloping downward and the second profile of the second layer may include a protrusion sloping upward as well as various other profiles. In accordance with the present disclosure, the second shower head with a different aperture design than the first shower head is used to adjust or compensate the first profile of the first deposited layer to provide a third profile (e.g., more planar or uniform) as desired by the user.

Figure 3:
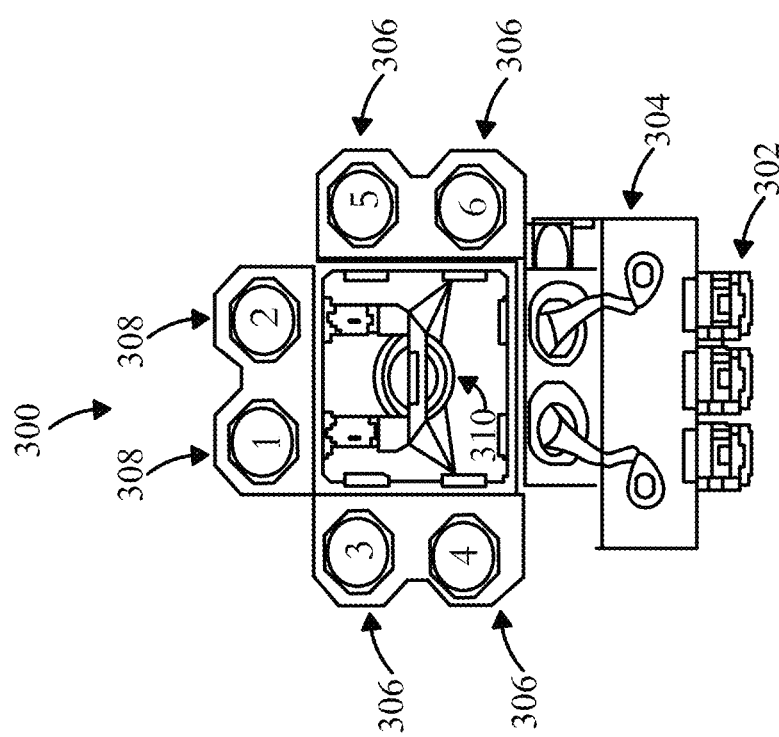
FIGS. 3 and 4 illustrate example tools for controlling CVD film profile uniformity in accordance with embodiments of the present disclosure.
Figure 4:
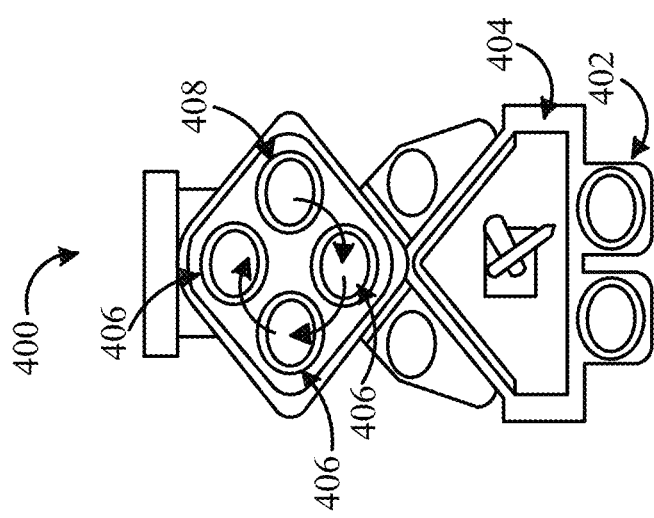

Referring now to FIGS. 3 and 4, example processing tools 300 and 400 are illustrated for controlling CVD film profile uniformity in accordance with embodiments of the present disclosure and in accordance with method 100 of FIG. 1 described above.

In accordance with one example, tool 300 includes front opening unified pods (FOUP) 302, a loading/unloading (L/UL) unit 304, reaction chambers 306 including a first shower head for depositing a first layer, reaction chambers 308 including a second shower head for depositing a second layer over the first layer, and a transfer mechanism 310 for transferring wafers between reaction chambers 306 and 308 and between the reaction chambers and L/UL unit 304. The first shower head of reaction chambers 306 have a first shower head aperture design which is different from the aperture design of the second shower head of reaction chambers 308.

Transfer mechanism 310 may include various transporters, conveyors, robot arms, and the like for operably transferring wafers between reaction chambers 306 and 308 and between the L/UL unit 304 and the reaction chambers. Robot arms may be configured to move translationally (e.g., linearly along a track), to turn over a wafer for providing processing access to both sides of a wafer, and/or to swing about a pivot point. Robot arms may include wafer engagement or handling tools, referred to as end effectors, which are mounted at the distal ends of the arms. These end effectors or other engagement tools may engage and support each wafer as it is transferred. In some instances, vacuum may be utilized to hold a wafer. The robot arms may handle one or more wafers simultaneously or individually as required.

In one embodiment, FOUP 302 is operably coupled to L/UL unit 304 and provides manual and/or automated access to the reaction chambers for processing of an IC wafer. Wafers may be transferred into and out of tool 300 through FOUP 302, and in some embodiments, a plurality of FOUPs 302 may be included in tool 300. In FIG. 3, three FOUPs 302 are illustrated but more or less FOUPs may be included.

In one embodiment, L/UL unit 304 is operably coupled between FOUP 302 and reaction chambers 306, 308, and includes robot arms for transferring wafers between FOUP 302 and the reaction chambers. The robot arms may be movable along a transverse axis in one embodiment to access a plurality of FOUPs 302. L/UL unit 304 may also be coupled to an inert gas supply in one embodiment to provide for an inert gas environment when transferring processed and dried wafers out of the tool 300.

In accordance with another example, tool 400 includes loadlock modules 402, a loading/unloading (L/UL) unit 404, reaction chambers 406 including a first shower head for depositing a first layer, and a reaction chamber 408 including a second shower head for depositing a second layer over the first layer. Wafers may be transferred between reaction chambers 406 and 408 which may rotate in one embodiment. The first shower head of reaction chambers 406 have a first shower head aperture design which is different from the aperture design of the second shower head of reaction chambers 408.

In one embodiment, loadlock module 402 is operably coupled to L/UL unit 404 and provides manual and/or automated access to the reaction chambers 406, 408 for processing of an IC wafer. Wafers may be transferred into and out of tool 400 through loadlock modules 402, and in some embodiments, a plurality of loadlock modules 402 may be included in tool 400. In FIG. 4, two loadlock modules 402 are illustrated but more or less loadlock modules may be included.

In one embodiment, L/UL unit 404 is operably coupled between loadlock module 402 and reaction chambers 406, 408, and may include robot arms for transferring wafers between loadlock module 402 and the reaction chambers 406, 408.

Each of tools 300 and 400 include a first reaction chamber housing a first shower head having a first shower head aperture design configured to deposit a first layer on a substrate by CVD, with the first layer having a first profile corresponding to the first shower head aperture design, and a second reaction chamber housing a second shower head having a second shower head aperture design configured to deposit a second layer over the first layer by CVD, with the second layer having a second profile corresponding to the second shower head aperture design which is different from the first shower head aperture design.

In accordance with one embodiment as illustrated in FIG. 2 and described above, the first profile of the first layer may include a protrusion sloping upward, the second profile of the second layer may include a depression sloping downward, and the third profile of the combined first layer and second layer may be more planar or uniform (i.e., flat relative to the substrate surface) than the first profile and/or the second profile. Advantageously, the second shower head may be selected to compensate the first profile of the first layer with the second profile of the second layer for providing the third profile of the combined first layer and second layer, the third profile being more planar than the first profile and/or the second profile.

It is noted that first reaction chambers 306 and 406 may not necessarily include the same shower heads and may include different shower heads with different aperture designs. Furthermore, second reaction chambers 308 and 408 may not necessarily include the same shower heads and may include different shower heads with different aperture designs. Instead, second reaction chambers 308 and 408 may include various compensating or modifying shower heads with different aperture designs that compensate or modify or adjust a first deposited layer. Examples of various compensating or modifying shower heads are described below with respect to FIGS. 7A-7C, 8A-8C, 9A-9C, and 10A-10C.

Although not shown, tools 300 and 400 may be operably coupled to a computer including software for automated wafer transferring and handling, CVD deposition, and selection of a second CVD chamber including a particular showerhead aperture design to name some of the control functions for tools 300 and 400. The computer system is suitable for implementing one or more embodiments of the present disclosure, and in various implementations may comprise a personal computing device such as a personal computer, laptop, cell phone, PDA, etc., or may comprise a network computing device such as a network server.

In accordance with various embodiments of the present disclosure, the computer system includes a bus or other communication mechanism for communicating information, which interconnects subsystems and components, such as processing component (e.g., processor, micro-controller, digital signal processor (DSP), etc.), system memory component (e.g., RAM), static storage component (e.g., ROM), disk drive component (e.g., magnetic or optical), network interface component (e.g., modem or Ethernet card), display component (e.g., CRT or LCD), input component (e.g., keyboard), and cursor control component (e.g., mouse or trackball). In one implementation, the disk drive component may comprise a database having one or more disk drive components.

In accordance with embodiments of the present disclosure, the computer system performs specific operations by the processor executing one or more sequences of one or more instructions contained in the system memory component. Such instructions may be read into the system memory component from another computer readable medium, such as a static storage component or a disk drive component. In other embodiments, hard-wired circuitry may be used in place of or in combination with software instructions to implement the present disclosure.

Logic may be encoded in a computer readable medium, which may refer to any medium that participates in providing instructions to the processor for execution. Such a medium may take many forms, including but not limited to, non-volatile media, volatile media, and transmission media. In various implementations, non-volatile media includes optical or magnetic disks, such as a disk drive component, volatile media includes dynamic memory, such as system memory component, and transmission media includes coaxial cables, copper wire, and fiber optics, including wires that comprise the bus. In one example, transmission media may take the form of acoustic or light waves, such as those generated during radio wave and infrared data communications.

Some common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer is adapted to read.

In various embodiments of the present disclosure, execution of instruction sequences to practice embodiments of the present disclosure may be performed by the computer system. In various other embodiments of the present disclosure, a plurality of computer systems coupled by a communication link (e.g., a network such as a LAN, WLAN, PTSN, and/or various other wired or wireless networks, including telecommunications, mobile, and cellular phone networks) may perform instruction sequences to practice the methods of the present disclosure in coordination with one another.

The computer system may transmit and receive messages, data, information and instructions, including one or more programs (i.e., application code) through the communication link and communication interface. Received program code may be executed by the processor as received and/or stored in the disk drive component or some other non-volatile storage component for execution.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

Figure 5:
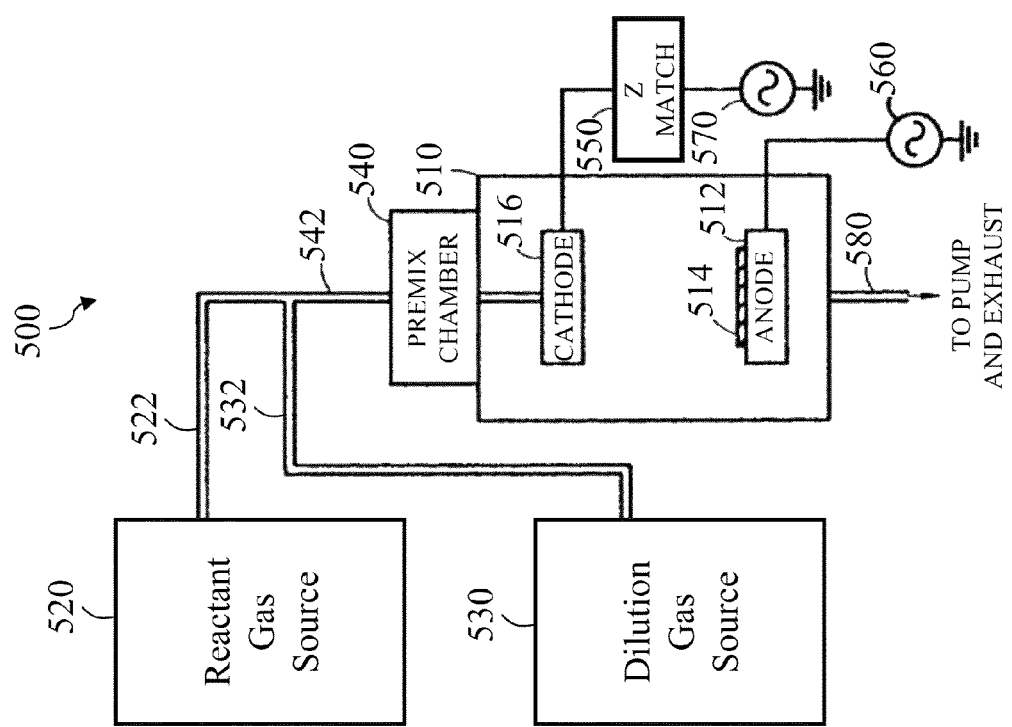
FIG. 5 illustrates a CVD chamber for controlling film profile uniformity in accordance with embodiments of the present disclosure.

Referring now to FIG. 5, a system 500 including a CVD chamber which may be used in tools 300 or 400 described above is illustrated for controlling film profile uniformity in accordance with embodiments of the present disclosure. System 500 includes a reaction chamber 510 (e.g., a CVD chamber) including a first electrode 512 configured to support a substrate 514 and a second electrode 516 disposed above the first electrode 512 and the substrate 514. System 500 further includes at least one reactant gas source 520 and at least one carrier gas source 530, each operably coupled to reaction chamber 510 for flowing at least one reactant gas and at least one carrier gas, respectively, into the reaction chamber 510. System 500 further includes an impedance matching unit 550 coupled to the second electrode 516 to apply a radio frequency (RF) power between the first and second electrodes 512 and 516. A tap setting may be applied to impedance matching unit 550 to control the RF power applied between the first and second electrodes 512 and 516. During a deposition operation, a first tap setting may be applied to the impedance matching unit corresponding to a first maximum RF power, and during a termination operation or plasma treatment operation, a second tap setting may be applied to the impedance matching unit corresponding to a second maximum RF power. A first RF power or voltage source 560 is coupled to first electrode 512, and a second RF power or voltage source 570 is coupled to impedance matching unit 550. A pump and exhaust feed line 580 is connected to the chamber 510 to provide pumping to establish partial vacuum conditions therein during PECVD operation and to provide a gas exhaust line used to flush out the system after a wafer processing operation has been completed. In one example, process pressure for deposition and/or plasma treatment may be set between about 1 Torr and about 100 Torr. Chamber 510 may also include heating elements to control the temperature within the chamber as desired. In one example, process temperature for deposition and/or plasma treatment may range between about 100 degrees Celsius and about 600 degrees Celsius.

In one example, chamber 510 is a PECVD reaction chamber suitable to carry out the above described processes or method 100. An example of a PECVD reaction chamber is available from the Novellus Corporation of San Jose, Calif. and sold under the trade name CONCEPT I. Other chambers may be used to carry out any of the methods described above.

In accordance with one aspect, first electrode 512 is opposed to second electrode 516 with a gap therebetween, and substrate 514 is disposed between the first and second electrodes 512 and 516. According to another aspect, first electrode 512 may function as an anode and be supplied with low frequency RF (LFRF) power from first RF power source 560, and second electrode 516 may function as a cathode and be supplied with high frequency RF (HFRF) power from second RF power source 570. In one embodiment, second electrode 516 may include a shower head electrode which is positioned operably adjacent the first electrode and configured to provide gaseous reactants into the chamber 510 from gas supply sources (e.g., reactant gas source 520, carrier gas source 530). In other embodiments, gaseous reactants may enter the chamber 510 through an inlet separate from the second electrode or through other means.

First electrode 512 is configured for supporting at least one substrate, e.g., in the form of a semiconductor wafer or dielectric substrate. The term "supporting" as used in this document and in connection with the first electrode is intended to mean holding or positioning one or more substrates in a desired orientation so that chemical vapor deposition can take place. Accordingly, substrate can be supported, held, or otherwise positioned in orientations other than the shown horizontal position. Furthermore, although a parallel plate PECVD chamber is illustrated, other RF power systems are applicable to perform the methods of the present disclosure, such as an inductive coil PECVD chamber as described in U.S. Pat. No. 6,705,246, the disclosure of which is incorporated by reference herein for all purposes. Furthermore, although chamber 510 is shown with two electrodes, it is to be understood that reaction chambers and methods can find use in systems which are not necessarily limited to only two electrodes. Furthermore, a single substrate is shown to be processed, but in other embodiments, a reaction chamber may be configured to process more than one substrate.

In accordance with one aspect, substrate 514 may include various semiconductor devices, and/or other suitable active and/or passive devices, at different stages of fabrication. Example semiconductor devices include integrated circuits including a metal-insulator-semiconductor field effect transistor (MOSFET) including complementary MOSFET (CMOS) features, CIS, and/or other suitable active and/or passive devices. In an embodiment, the substrate may include an integrated circuit (or portion thereof) designed and formed using a CMOS-based process. A substrate having a device (e.g., integrated circuit) formed by other semiconductor fabrication technologies is also within the scope of the described method.

In one embodiment, substrate 514 may include a semiconductor substrate, and may be comprised of silicon, or alternatively may include silicon germanium, gallium arsenic, or other suitable semiconductor materials. The semiconductor substrate may include underlying layers, devices, junctions, and other features (not shown) formed during prior process steps or which may be formed during subsequent process steps.

In accordance with one aspect, reactant gas source 520 and carrier gas source 530 may each include reservoirs and are coupled to a premix chamber 540 via feed lines 522, 532, and common gas feed line 542. At least one reactant gas and at least one carrier gas from reactant gas source 520 and dilution gas source 530, respectively, may be provided to premix chamber 540 for premixing into a substantially uniform gas mixture prior to flow into reaction chamber 510. In one example, premix chamber 540 is disposed directly adjacent to chamber 510.

Reactant gas source 520 may include a conventional bubbler chamber, a heater coil, a shut-off valve, and/or an output port. In one example, reactant gas source 520 may provide various reactant gases depending on the desired layer to be deposited, for example a silicon layer, a metal layer, or a dielectric layer. In one example, reactant gases may include but are not limited to silicon-containing materials, nitrogen-containing materials, organic materials, metal-containing materials, halogen gas, combinations thereof, and the like. Although a single reactant gas source 520 is illustrated, system 500 may include a plurality of reactant gas sources as desired and coupled in a similar manner as reactant gas source 520 to reaction chamber 510.

Dilution gas source 530 may include a heater coil, a shut-off valve, and/or an output port and may provide various dilution gases, including but not limited to inert gases, helium, argon, combinations thereof, and the like.

Although not necessarily shown, reactant gas and dilution gas may be flowed from reactant gas source 520 and dilution gas source 530 to deposition chamber 510 through various apparatus such as flow lines, pressure regulators, valves, mass flow controllers or other flow controllers, manifolds, and/or regulators. In one example, mass flow controllers may be of the electronic type wherein a variable set point may be established to provide a constant chosen gas flow rate and to automatically compensate for external parameter variations, such as variations in temperature and variations in pressures in the various flow lines of the system. The manifolds may be used to provide premixing of the various combined gases.

Both of the feed lines 522 and 532 may be provided with shut-off valves which may be used at any time to both start up and shut down the system operation. Shut-off valves may also be included in reactant gas source 520 and/or dilution gas source 530.

System 500 may further include a purge gas source that is operably coupled to chamber 510 for flowing a purge gas into chamber 510 prior to deposition start up and may also be used to flush the system. The purge gas source may provide various purge gases, including but not limited to nitrogen or argon.

In one example operation, substrate 514 may be a silicon wafer or a dielectric substrate disposed on an upper surface of the anode electrode, and the silicon wafer may have been processed to various stages toward completion of the ultimate or complete integrated circuit being fabricated. For example, the wafer may have been processed to the stage where conductive interconnect strips have been disposed and interconnected on the wafer surface and are now ready to receive a protective dielectric coating of either silicon oxide or silicon nitride, or both, thereon. Substrate 514 may include a 450 mm wafer in one example.

In one embodiment, the power ratios received from the low frequency RF source 560 and the high frequency RF source 570 may be varied in order to vary the stress of the deposited dielectric layer from a highly tensile state to a highly compressive state. In one example, the high frequency RF source 570 may be operated at 13.56 megahertz and the low frequency RF source 560 may be operated between 10-400 kilohertz. As an example, the total RF power applied to the PECVD chamber may range between about 0 watts and about 200 watts. Although two RF power sources 560 and 570 are illustrated, a single RF power source may be used to apply RF power to each electrode 512 and 516 in another embodiment. An example of an RF power splitter and a single RF power source is illustrated and described in U.S. Pat. No. 6,705,246, the disclosure of which has been previously incorporated by reference herein.

The high frequency RF source 570 is connected as shown through an impedance matching unit 550 for impedance matching purposes, which may substantially prevent high frequency RF power from being reflected back into the RF source 570 and to maximize the amount of RF power absorbed by the plasma. Impedance matching unit 550 includes various capacitive and inductive components which are configured for impedance matching and for maximizing power applied between the first and second electrodes 512, 516 of reaction chamber 510.

Tap settings may be applied to the impedance matching unit coupled to the second electrode to apply a maximum radio frequency (RF) power between the first and second electrodes. Tap settings corresponding to applied maximum RF power may depend on various process parameters.

RF sources 560 and 570 are configured to provide RF power to the electrodes which is effective to both develop a plasma processing environment within the processing chamber and to provide a desired bias relative to the substrate. For example, a power differential between the electrodes may facilitate acceleration of ions or ionic species toward the subject substrate which may enhance conformal coverage and/or provide greater uniformity in film or layer composition.

It is also within the scope of the present disclosure and the claims appended hereto to deposit materials other than those specifically described above by modifying the reactant gas sources in a controlled manner by those skilled in the art. In addition, for at least some of the above described processes, it is possible to operate the reactant gas source and dilution gas source at room temperature and thereby eliminate the heating element as previously described. That is, the various vapor and gas delivery lines described above and located between the gas sources and the reaction chamber 510 may be relatively short, so that it is possible to obtain an adequate vapor flow rate in the delivery lines of this system at room temperature.

It is further possible to operate the reaction chamber 510 in all of the above examples within a wide temperature range of between about 100 degrees Celsius and about 600 degrees Celsius as a matter of choice and depending upon whether higher temperatures would unduly degrade a semiconductor structure being processed. Accordingly, these and other process and materials variations are clearly within the scope of the following appended claims.

Referring now to FIGS. 6A-6C, a first shower head aperture design (FIG. 6A), a corresponding CVD film profile uniformity control system and plasma flow pattern (FIG. 6B), and corresponding film profiles (FIG. 6C) are respectively illustrated in accordance with embodiments of the present disclosure.

FIG. 6A shows a bottom view of shower head 616 including a plurality of apertures 602 in concentric circles from a center of the shower head (apertures 602a) to an outer circumference of the shower head (apertures 602b). In this embodiment, the pattern or design of apertures 602 moves in concentric circles substantially from the center of the shower head fully to the outer circumference of the shower head. In one embodiment, the pattern of apertures 602 of shower head 616 may be considered a first shower head aperture design.

Similar to the electrodes and substrate described above with respect to FIG. 5, FIG. 6B shows a first electrode 612 opposed to a second electrode 616 with a gap therebetween, and a substrate 614 disposed between the first and second electrodes 612 and 616. First electrode 612 may function as an anode and be supplied with low frequency RF (LFRF) power from a first RF power source, and second electrode 616 may function as a cathode and be supplied with high frequency RF (HFRF) power from a second RF power source. Second electrode 616 includes a shower head which is positioned operably adjacent the first electrode and configured to provide gaseous reactants into a chamber (e.g., chamber 510) from gas supply sources (e.g., reactant gas source 520, carrier gas source 530). A plasma flow pattern 620 illustrates the deposition of a layer. Similar elements described above with respect to FIG. 5 are fully applicable in this embodiment although corresponding descriptions may not be included below to avoid repetitive descriptions.

FIG. 6C illustrates film profiles 601a or 601b that a deposited layer may have using shower head 616 and the corresponding shower head aperture design, based upon deposition parameters such as the precursor gases used, gas flow, process temperature, and process pressure. Film profile 601a includes a protrusion sloping upward from the substrate 614, and film profile 601b includes a depression sloping downward toward the substrate 614.

Referring now to FIGS. 7A-7C, 8A-8C, 9A-9C, and 10A-10C, examples of second shower head aperture designs, corresponding CVD film profile uniformity control systems and plasma flow patterns, and corresponding film profiles are respectively illustrated in accordance with embodiments of the present disclosure.

Figure 7C:
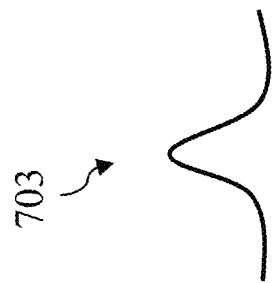
Figure 7B:
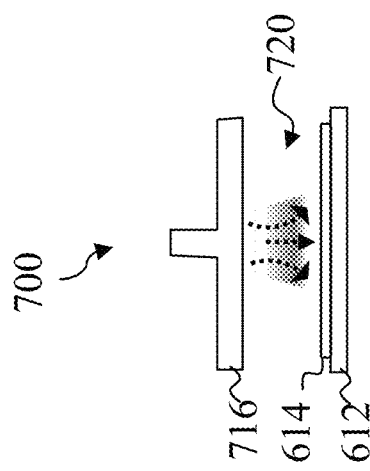
Figure 7A:
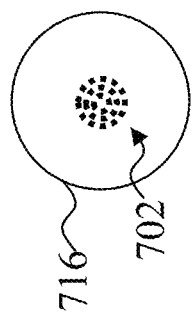

FIG. 7A shows a bottom view of shower head 716 including a plurality of apertures 702 in concentric circles from a center of the shower head toward an outer circumference of the shower head. In this embodiment, the pattern or design of apertures 702 moves in concentric circles substantially from the center of the shower head toward the outer circumference of the shower head but does not fully reach the outer circumference of the shower head. In other words, in one example, the shower head aperture design 702 includes a portion of the apertures in concentric circles of the shower head aperture design 602 of shower head 616. In other words, in another example, the shower head aperture design 702 includes apertures in concentric circles and the shower head aperture design 602 includes apertures in concentric circles at different locations than the shower head aperture design 702. In one embodiment, the pattern of apertures 702 of shower head 716 are concentrated at the center of the shower head face and may be considered an example second shower head aperture design.

Similar to the electrodes and substrate described above with respect to FIG. 5, FIG. 7B shows first electrode 612 opposed to a second electrode 716 with a gap therebetween, and a substrate 614 disposed between the first and second electrodes 612 and 716. First electrode 612 may function as an anode and be supplied with low frequency RF (LFRF) power from a first RF power source, and second electrode 716 may function as a cathode and be supplied with high frequency RF (HFRF) power from a second RF power source. Second electrode 716 includes a shower head which is positioned operably adjacent the first electrode and configured to provide gaseous reactants into a chamber (e.g., chamber 510) from gas supply sources (e.g., reactant gas source 520, carrier gas source 530). A plasma flow pattern 720 illustrates the deposition of a layer. Similar elements described above with respect to FIG. 5 are fully applicable in this embodiment although corresponding descriptions may not be included below to avoid repetitive descriptions.

FIG. 7C illustrates film profile 703 that a deposited layer may have using shower head 716 and the corresponding shower head aperture design. Film profile 703 includes a single protrusion sloping upward from the substrate 614.

FIG. 8A shows a bottom view of shower head 816 including a plurality of apertures 802 in concentric circles from a center of the shower head toward an outer circumference of the shower head. In this embodiment, the pattern or design of apertures 802 forms a flat ring substantially in the middle of the shower head face and does not include apertures at the center of the shower head face or the outer circumference of the shower head face. In other words, in one example, the shower head aperture design 802 includes a portion of the apertures in concentric circles of the shower head aperture design 602 of shower head 616. In other words, in another example, the shower head aperture design 802 includes apertures in concentric circles and the shower head aperture design 602 includes apertures in concentric circles at different locations than the shower head aperture design 802. In one embodiment, the pattern of apertures 802 of shower head 816 may be considered an example second shower head aperture design.

Similar to the electrodes and substrate described above with respect to FIG. 5, FIG. 8B shows first electrode 612 opposed to a second electrode 816 with a gap therebetween, and a substrate 614 disposed between the first and second electrodes 612 and 816. First electrode 612 may function as an anode and be supplied with low frequency RF (LFRF) power from a first RF power source, and second electrode 816 may function as a cathode and be supplied with high frequency RF (HFRF) power from a second RF power source. Second electrode 816 includes a shower head which is positioned operably adjacent the first electrode and configured to provide gaseous reactants into a chamber (e.g., chamber 510) from gas supply sources (e.g., reactant gas source 520, carrier gas source 530). A plasma flow pattern 820 illustrates the deposition of a layer. Similar elements described above with respect to FIG. 5 are fully applicable in this embodiment although corresponding descriptions may not be included below to avoid repetitive descriptions.

FIG. 8C illustrates film profile 803 that a deposited layer may have using shower head 816 and the corresponding shower head aperture design. Film profile 803 includes a pair of protrusions sloping upward from the substrate 614.

Figures 9A, 9B, 9C:
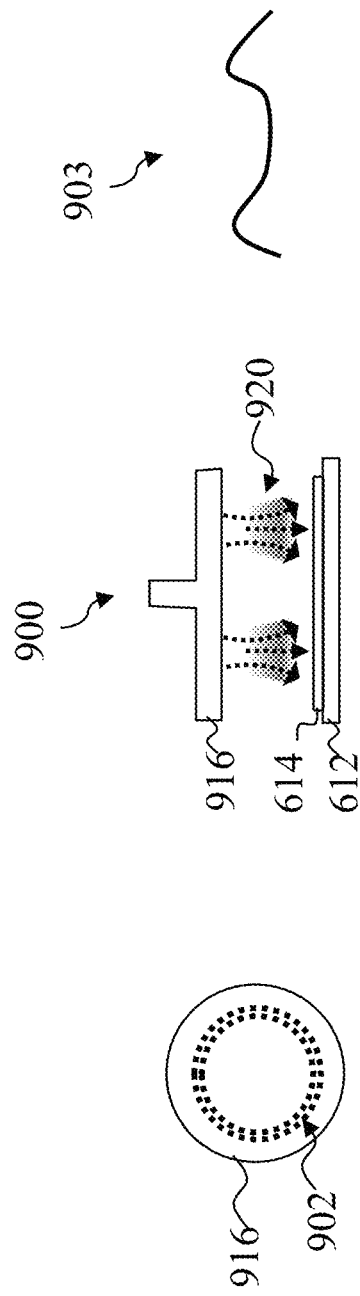

FIG. 9A shows a bottom view of shower head 916 including a plurality of apertures 902 in concentric circles from a center of the shower head toward an outer circumference of the shower head. In this embodiment, the pattern or design of apertures 902 forms a flat ring substantially in the middle of the shower head face and does not include apertures at the center of the shower head or the outer circumference of the shower head face. In this embodiment, the pattern or design of apertures 902 has a larger inner and outer diameter than the pattern or design of apertures 802 of FIG. 8A. In other words, in one example, the shower head aperture design 902 includes a portion of the apertures in concentric circles of the shower head aperture design 602 of shower head 616. In other words, in another example, the shower head aperture design 902 includes apertures in concentric circles and the shower head aperture design 602 includes apertures in concentric circles at different locations than the shower head aperture design 902. In one embodiment, the pattern of apertures 902 of shower head 916 may be considered an example second shower head aperture design.

Similar to the electrodes and substrate described above with respect to FIG. 5, FIG. 9B shows first electrode 612 opposed to a second electrode 916 with a gap therebetween, and a substrate 614 disposed between the first and second electrodes 612 and 916. First electrode 612 may function as an anode and be supplied with low frequency RF (LFRF) power from a first RF power source, and second electrode 916 may function as a cathode and be supplied with high frequency RF (HFRF) power from a second RF power source. Second electrode 916 includes a shower head which is positioned operably adjacent the first electrode and configured to provide gaseous reactants into a chamber (e.g., chamber 510) from gas supply sources (e.g., reactant gas source 520, carrier gas source 530). A plasma flow pattern 920 illustrates the deposition of a layer. Similar elements described above with respect to FIG. 5 are fully applicable in this embodiment although corresponding descriptions may not be included below to avoid repetitive descriptions.

FIG. 9C illustrates film profile 903 that a deposited layer may have using shower head 916 and the corresponding shower head aperture design. Film profile 903 includes a pair of protrusions sloping upward from the substrate 614 and disposed near the outer edge or circumference of the wafer.

FIG. 10A shows a bottom view of shower head 1016 including a plurality of apertures 1002 in concentric circles from a center of the shower head toward an outer circumference of the shower head. In this embodiment, the pattern or design of apertures 1002 forms a flat ring substantially in at the outer edge of the shower head face and does not include apertures at the center of the shower head face. In this embodiment, the pattern or design of apertures 1002 has a larger inner and outer diameter than the pattern or design of apertures 902 of FIG. 9A. In other words, in one example, the shower head aperture design 1002 includes a portion of the apertures in concentric circles of the shower head aperture design 602 of shower head 616. In other words, in another example, the shower head aperture design 1002 includes apertures in concentric circles and the shower head aperture design 602 includes apertures in concentric circles at different locations than the shower head aperture design 1002. In one embodiment, the pattern of apertures 1002 of shower head 1016 may be considered an example second shower head aperture design.

Similar to the electrodes and substrate described above with respect to FIG. 5, FIG. 10B shows first electrode 612 opposed to a second electrode 1016 with a gap therebetween, and a substrate 614 disposed between the first and second electrodes 612 and 1016. First electrode 612 may function as an anode and be supplied with low frequency RF (LFRF) power from a first RF power source, and second electrode 1016 may function as a cathode and be supplied with high frequency RF (HFRF) power from a second RF power source. Second electrode 1016 includes a shower head which is positioned operably adjacent the first electrode and configured to provide gaseous reactants into a chamber (e.g., chamber 510) from gas supply sources (e.g., reactant gas source 520, carrier gas source 530). A plasma flow pattern 1020 illustrates the deposition of a layer. Similar elements described above with respect to FIG. 5 are fully applicable in this embodiment although corresponding descriptions may not be included below to avoid repetitive descriptions.

FIG. 10C illustrates film profile 1003 that a deposited layer may have using shower head 1016 and the corresponding shower head aperture design. Film profile 1003 includes a depression sloping downward toward substrate 614 and a pair of protrusions sloping upward from the substrate 614 and disposed at the outer edge or circumference of the wafer.

It should be noted that in other embodiments, the shower head aperture designs and film profiles of FIGS. 7A-7C, 8A-8C, 9A-9C, and 10A-10C may be considered first shower head aperture designs and first film profiles and the shower head aperture design and film profile of FIG. 6A-6C may be considered a second shower head aperture design and second film profile.

Thus, the present disclosure provides for various embodiments. According to one embodiment, a method for controlling chemical vapor deposition (CVD) film profile uniformity includes depositing a first layer on a substrate by CVD with a first shower head, the first layer having a first profile, and depositing a second layer over the first layer by CVD with a second shower head, the second layer having a second profile. The combined first layer and second layer have a third profile, and the first profile, the second profile, and the third profile are different from one another.

In another embodiment, a method for controlling chemical vapor deposition (CVD) film profile uniformity includes depositing a first layer over a wafer by CVD with a first shower head, with the first layer having a first profile corresponding to a first shower head aperture design, and selecting a second shower head having a second shower head aperture design associated with a second profile for adjusting the first profile. The method further includes depositing a second layer over the first layer by CVD with the second shower head, the second layer having the second profile. The combined first layer and second layer have a third profile which is more planar than the first profile and/or the second profile.

In yet another embodiment, a system for controlling chemical vapor deposition (CVD) film profile uniformity includes a first shower head having a first shower head aperture design configured to deposit a first layer on a substrate by CVD, the first layer having a first profile corresponding to the first shower head aperture design, and a second shower head having a second shower head aperture design configured to deposit a second layer over the first layer by CVD, the second layer having a second profile corresponding to the second shower head aperture design which is different from the first shower head aperture design.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method of controlling chemical vapor deposition (CVD) film profile uniformity in a single chamber, the method comprising: depositing a first layer on a substrate by CVD with a first shower head, the first layer having a first deposition profile having a first curvature and a first center thickness; and depositing a second layer over the first layer by CVD with a second shower head, the second layer having a second deposition profile having a second curvature different from the first curvature wherein the combined first layer and second layer have a third deposition profile, and wherein the first deposition profile, the second deposition profile, and the third deposition profile are different from one another.

2. The method of claim 1, wherein the first deposition profile of the first layer includes a protrusion sloping upward, the second deposition profile of the second layer includes a depression sloping downward, and the third deposition profile of the combined first layer and second layer is more planar than the first deposition profile and/or the second deposition profile.

3. The method of claim 1, wherein the second shower head has a second shower head aperture design including apertures in concentric circles, and the first shower head has a first shower head aperture design including apertures in concentric circles at different locations than the second shower head aperture design.

4. The method of claim 1, further comprising selecting the second shower head to compensate the first deposition profile of the first layer with the second deposition profile of the second layer for providing the third deposition profile of the combined first layer and second layer which is more planar than the first deposition profile and/or the second deposition profile.

5. The method of claim 1, further comprising depositing a third layer over the second layer by CVD with a third shower head, the third shower head having a different aperture design than the first shower head and the second shower head.

6. The method of claim 1, further comprising flowing a reactant gas and a dilution gas through the first shower head or the second shower head for plasma enhanced CVD (PECVD) or metal-organic CVD (MOCVD).

7. A method of controlling chemical vapor deposition (CVD) film profile uniformity in a single chamber, the method comprising: depositing a first layer over a wafer by CVD with a first shower head, the first layer having a first deposition profile having a first curvature corresponding to a first shower head aperture design and a first center thickness; selecting a second shower head having a second shower head aperture design associated with a second deposition profile having a second curvature different than the first curvature for adjusting the first profile; and depositing a second layer over the first layer by CVD with the second shower head, the second layer having the second deposition profile wherein the combined first layer and second layer have a third deposition profile which is more planar than the first deposition profile and/or the second deposition profile.

8. The method of claim 7, wherein the first deposition profile of the first layer includes a protrusion sloping upward, the second deposition profile of the second layer includes a depression sloping downward, and the third profile of the combined first layer and second layer is more planar than the first deposition profile and/or the second deposition profile.

9. The method of claim 7, wherein the second shower head aperture design includes apertures in concentric circles, and the first shower head aperture design includes apertures in concentric circles at different locations than the second shower head aperture design.

10. The method of claim 7, further comprising depositing a third layer over the second layer by CVD with a third shower head, the third shower head having a different aperture design than the first shower head aperture design and the second shower head aperture design.

11. The method of claim 7, further comprising flowing a reactant gas and a dilution gas through the first shower head or the second shower head for plasma enhanced CVD (PECVD) or metal-organic CVD (MOCVD).

12. A system for controlling chemical vapor deposition (CVD) film profile uniformity, the system comprising: a first shower head having a first shower head aperture design configured to deposit a first layer on a substrate by CVD, the first layer having a first deposition profile having a first curvature corresponding to the first shower head aperture design and a second shower head having a second shower head aperture design configured to deposit a second layer over the first layer by CVD, the second layer having a second deposition profile having a second curvature different than the first curvature corresponding to the second shower head aperture design which is different from the first shower head aperture design wherein the first shower head and the second shower head are each disposed within a single reaction chamber.

13. The system of claim 12, wherein the first shower head aperture design includes apertures in concentric circles from a center of the first shower head to an outer circumference of the first shower head, and wherein the second shower head aperture design includes a portion of the apertures in concentric circles of the first shower head aperture design.

14. The system of claim 12, wherein the second shower head aperture design includes apertures in concentric circles, and wherein the first shower head aperture design includes apertures in concentric circles at different locations than the second shower head aperture design.

15. The system of claim 12, wherein the first shower head is configured to deposit the first layer having the first deposition profile including a protrusion sloping upward, wherein the second shower head is configured to deposit the second layer having the second deposition profile including a depression sloping downward, and wherein the third deposition profile of the combined first layer and second layer is more planar than the first deposition profile and/or the second deposition profile.

16. The system of claim 12, further comprising a reactant gas source and a dilution gas source configured to flow a reactant gas and a dilution gas, respectively, through the first shower head or the second shower head for plasma enhanced CVD (PECVD) or metal-organic CVD (MOCVD).

* * * * *